(12) United States Patent
Bergbauer et al.

(10) Patent No.: US 11,677,045 B2
(45) Date of Patent: Jun. 13, 2023

(54) OPTOELECTRONIC SEMICONDUCTOR BODY AND LIGHT-EMITTING DIODE

(71) Applicant: OSRAM OLED GmbH, Regensburg (DE)

(72) Inventors: Werner Bergbauer, Windberg (DE); Joachim Hertkorn, Wörth an der Donau (DE); Alexander Walter, Laaber (DE)

(73) Assignee: OSRAM OLED GmbH, Regensburg (DE)

( * ) Notice: Subject to any disclaimer, the term of this patent is extended or adjusted under 35 U.S.C. 154(b) by 82 days.

(21) Appl. No.: 17/315,198

(22) Filed: May 7, 2021

(65) Prior Publication Data

US 2021/0265531 A1     Aug. 26, 2021

Related U.S. Application Data

(62) Division of application No. 16/313,945, filed as application No. PCT/EP2017/065708 on Jun. 26, 2017, now Pat. No. 11,018,281.

(30) Foreign Application Priority Data

Jun. 29, 2016 (DE) .................... 10 2016 111 929.6

(51) Int. Cl.
*H01L 33/32* (2010.01)
*H01L 33/06* (2010.01)
(Continued)

(52) U.S. Cl.
CPC ........ *H01L 33/325* (2013.01); *H01L 33/0075* (2013.01); *H01L 33/06* (2013.01); *H01L 33/145* (2013.01); *H01L 33/32* (2013.01)

(58) Field of Classification Search
CPC ... H01L 33/0075; H01L 33/145; H01L 33/32; H01L 33/06; H01L 33/325; H01L 33/24;
(Continued)

(56) References Cited

U.S. PATENT DOCUMENTS 5,959,307 A * 9/1999 Nakamura ............. H01S 5/343
257/14
6,388,275 B1 * 5/2002 Kano .................. H01S 5/34333
257/11
(Continued)

FOREIGN PATENT DOCUMENTS

EP     2 144 306 A1    1/2010
EP     2 408 028 A2    1/2012
(Continued)

*Primary Examiner* — Mouloucoulaye Inoussa
(74) *Attorney, Agent, or Firm* — DLA Piper LLP (US)

(57) ABSTRACT

A light-emitting diode includes a semiconductor body and electrical connection points for contacting the semiconductor body, the semiconductor body including an active region including a quantum well that generates electromagnetic radiation, a first region and a second region that impede passage of charge carriers from the active region, wherein the semiconductor body is based on a nitride compound semiconductor material, the first region is directly adjacent to the active region on a p-side, the second region is arranged on a side of the first region facing away from the active region, the first region has an electronic band gap larger than the electronic band gap of the quantum well and less than or equal to an electronic band gap of the second region, the first region and the second region contain aluminum, and the active region emits electromagnetic radiation having a peak wavelength of less than 480 nm.

16 Claims, 2 Drawing Sheets

(51) Int. Cl.
  *H01L 33/14* (2010.01)
  *H01L 33/00* (2010.01)
(58) Field of Classification Search
  CPC ....... H01L 33/04; H01L 21/205; H01L 33/12; H01L 33/025; H01L 33/0025; H01L 33/14; H01S 5/221; H01S 5/3215; H01S 5/1003; H01S 5/32316; H01S 5/3213; H01S 5/323
  USPC ............. 257/13, 14, 196, 615, 201, 79, 103, 257/E33.008, E21.126, E33.016, E33.005, 257/E21.09, E29.328; 438/35
  See application file for complete search history.

(56) References Cited

U.S. PATENT DOCUMENTS

| | | | | |
|---|---|---|---|---|
| 6,396,861 B1* | 5/2002 | Shimizu | ............... | H01S 5/34 372/45.01 |
| 6,849,881 B1* | 2/2005 | Harle | ............... | H01L 33/06 257/190 |
| 2003/0132448 A1* | 7/2003 | Tsujimura | ............... | H01L 33/06 257/101 |
| 2004/0051105 A1* | 3/2004 | Tsuda | ............... | B82Y 20/00 257/79 |
| 2004/0051107 A1* | 3/2004 | Nagahama | ............... | H01L 21/0254 257/79 |
| 2004/0056259 A1* | 3/2004 | Goto | ............... | B82Y 20/00 438/22 |
| 2005/0127391 A1* | 6/2005 | Yanamoto | ............... | B82Y 20/00 257/14 |
| 2005/0224781 A1* | 10/2005 | Kneissl | ............... | H01S 5/34333 257/14 |
| 2005/0285125 A1* | 12/2005 | Kim | ............... | B82Y 20/00 257/94 |
| 2006/0097242 A1 | 5/2006 | Kuramoto | | |
| 2007/0008998 A1* | 1/2007 | Ohta | ............... | H01L 33/32 372/43.01 |
| 2007/0272936 A1 | 11/2007 | Shin | | |
| 2007/0290230 A1* | 12/2007 | Kawaguchi | ............... | H01S 5/34333 257/E29.328 |
| 2008/0073658 A1 | 3/2008 | Wirth | | |
| 2008/0149918 A1* | 6/2008 | Yoo | ............... | H01L 33/32 257/17 |
| 2008/0247435 A1* | 10/2008 | Choi | ............... | B82Y 20/00 372/46.01 |
| 2009/0224226 A1* | 9/2009 | Huang | ............... | H01L 33/06 257/E29.069 |
| 2010/0008393 A1* | 1/2010 | Enya | ............... | H01L 33/32 372/46.01 |
| 2010/0270531 A1* | 10/2010 | Samal | ............... | B82Y 20/00 257/E33.025 |
| 2011/0084249 A1* | 4/2011 | Oh | ............... | H01L 33/02 257/E33.014 |
| 2012/0012815 A1 | 1/2012 | Moon | | |
| 2012/0145993 A1 | 6/2012 | Na et al. | | |
| 2014/0110720 A1 | 4/2014 | Choi et al. | | |
| 2014/0117306 A1 | 5/2014 | Lin et al. | | |
| 2014/0191192 A1* | 7/2014 | Han | ............... | H01L 33/0025 257/13 |
| 2014/0231838 A1* | 8/2014 | Tokuda | ............... | H01L 33/04 438/47 |
| 2014/0319454 A1* | 10/2014 | Park | ............... | H01L 33/32 257/13 |
| 2014/0320299 A1* | 10/2014 | Kirk | ............... | H01H 9/54 340/691.8 |
| 2014/0361246 A1* | 12/2014 | Moon | ............... | H01L 33/0008 257/13 |
| 2015/0129835 A1 | 5/2015 | Yamane | | |
| 2016/0056325 A1* | 2/2016 | Maeng | ............... | H01L 33/325 257/13 |
| 2017/0213935 A1* | 7/2017 | Park | ............... | H01L 33/0025 |
| 2017/0294554 A1* | 10/2017 | Tani | ............... | H01L 33/24 |
| 2019/0123239 A1* | 4/2019 | Shatalov | ............... | H01L 33/12 |
| 2019/0273362 A1* | 9/2019 | Lauer | ............... | H01S 5/221 |

FOREIGN PATENT DOCUMENTS

| | | |
|---|---|---|
| EP | 2 722 897 A1 | 4/2014 |
| WO | 2016/052997 A1 | 4/2016 |

\* cited by examiner

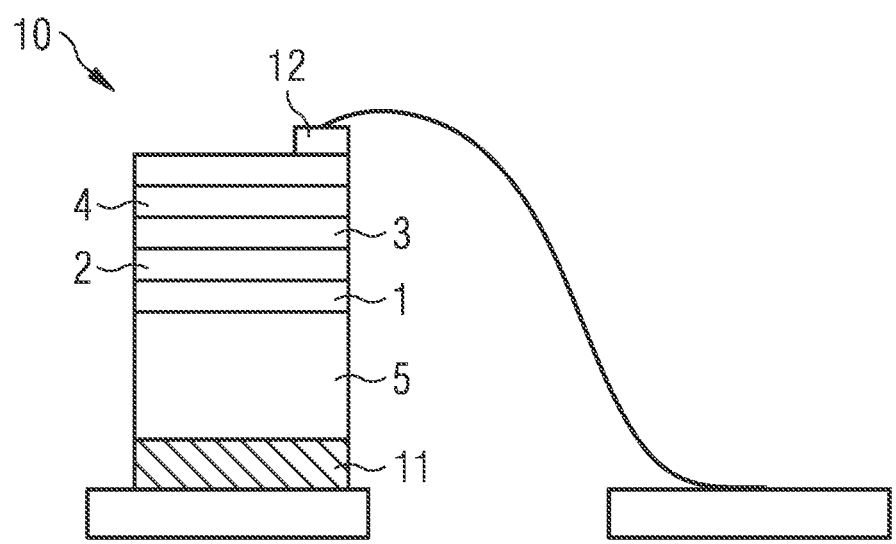

OPTOELECTRONIC SEMICONDUCTOR BODY AND LIGHT-EMITTING DIODE

TECHNICAL FIELD

This disclosure relates to an optoelectronic semiconductor body and a light-emitting diode having such an optoelectronic semiconductor body.

BACKGROUND

US 2008/0073658 A1 describes a semiconductor body. There is, however, a need to provide a semiconductor body and a light-emitting diode having such a semiconductor body having a particularly favorable aging behavior.

SUMMARY

We provide an optoelectronic semiconductor body including an active region including a quantum well that generates electromagnetic radiation, a first region that impedes passage of charge carriers from the active region, and a second region that impedes passage of charge carriers from the active region, wherein the semiconductor body is based on a nitride compound semiconductor material, the first region is directly adjacent to the active region on a p-side, the second region is arranged on a side of the first region facing away from the active region, the first region has an electronic band gap larger than the electronic band gap of the quantum well and less than or equal to an electronic band gap of the second region, and the first region and the second region contain aluminum.

We also provide a light-emitting diode including the semiconductor body including an active region including a quantum well that generates electromagnetic radiation, a first region that impedes passage of charge carriers from the active region, and a second region that impedes passage of charge carriers from the active region, wherein the semiconductor body is based on a nitride compound semiconductor material, the first region is directly adjacent to the active region on a p-side, the second region is arranged on a side of the first region facing away from the active region, the first region has an electronic band gap larger than the electronic band gap of the quantum well and less than or equal to an electronic band gap of the second region, the first region and the second region contain aluminum, and electrical connection points for contacting the semiconductor body, wherein the light-emitting diode emits electromagnetic radiation having a peak wavelength of less than 480 nm.

We further provide a light-emitting diode including a semiconductor body and electrical connection points for contacting the semiconductor body, the semiconductor body including an active region including a quantum well that generates electromagnetic radiation, a first region that impedes passage of charge carriers from the active region, and a second region that impedes passage of charge carriers from the active region, wherein the semiconductor body is based on a nitride compound semiconductor material, the first region is directly adjacent to the active region on a p-side, the second region is arranged on a side of the first region facing away from the active region, the first region has an electronic band gap larger than the electronic band gap of the quantum well and less than or equal to an electronic band gap of the second region, the first region and the second region contain aluminum, and the active region emits electromagnetic radiation having a peak wavelength of less than 480 nm.

BRIEF DESCRIPTION OF THE DRAWINGS

FIG. 3 is a schematic sectional illustration of an example of a light-emitting diode.

Figure 1:
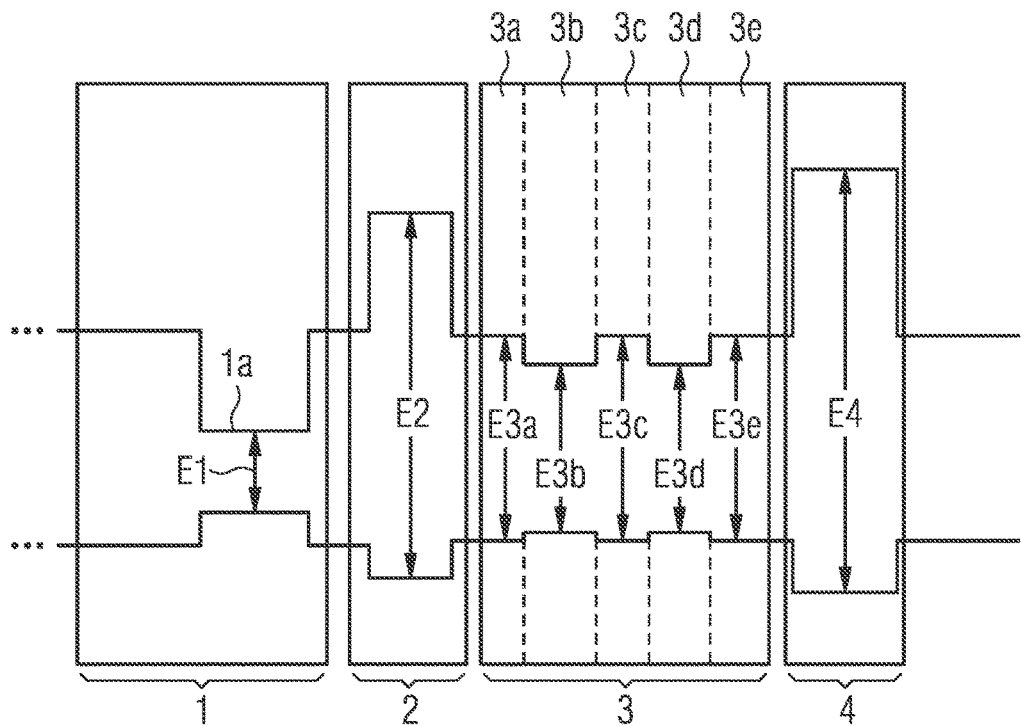
FIG. 1 is a schematic illustration of an example of an optoelectronic semiconductor body.

REFERENCES 1 active region
1a quantum well
2 first region
3 intermediate region
3a, b, c, d, e, f subregions
4 second region
5 n-type region
10 semiconductor body
11, 12 connection points
E1, E2, E3a,b,c,d,e, E4 band gaps

DETAILED DESCRIPTION

We provide an optoelectronic semiconductor body. The optoelectronic semiconductor body may, for example, be a radiation-emitting semiconductor body used in a light-emitting diode or in a laser diode.

The optoelectronic semiconductor body may comprise an active region that generates electromagnetic radiation. For this purpose, the active region comprises at least one quantum well, in particular a plurality of quantum wells separated from one another by barriers. The active region can in particular generate UV radiation or blue light during operation.

The semiconductor body may comprise a first region that impedes the passage of charge carriers, in particular electrons, from the active region. The first region is therefore a region that blocks charge carriers, in particular electrons, from the active region so that they are more likely to remain in the active region than they would be without the first region. The first region can therefore contribute to limiting or preventing the loss of charge carriers, in particular electrons, in the active region.

The optoelectronic semiconductor body may comprise a second region that impedes the passage of charge carriers, in particular electrons, from the active region. In other words, the optoelectronic semiconductor body comprises, in addition to the first region, a further region that likewise impedes or prevents the exit of charge carriers, in particular electrons, from the active region. The first region and the second region therefore ensure, that the probability of charge carriers, in particular electrons, leaving the active region is reduced.

The optoelectronic semiconductor body may be based on a nitride compound semiconductor material. Here and in the following, this entails that the semiconductor body or at least a part thereof, particularly preferably at least the active region, the first region and the second region, comprises or consists of a nitride compound semiconductor material, preferably $Al_nGa_mIn_{1-n-m}N$, wherein $0 \leq n \leq 1$, $0 \leq m \leq 1$ and $n+m \leq 1$. This material does not necessarily have to have a mathematically exact composition according to the above formula. Rather, it may have, for example, one or more dopants and additional constituents. For the sake of simplicity, however, the above formula only contains the essential constituents of the crystal lattice (Al, Ga, In, N), even if they may be partially replaced and/or supplemented by small quantities of further substances.

The first region may be directly adjacent to the active region on a p-side. That is to say that in a direction transverse or perpendicular to the main plane of extension of the semiconductor body, for example, in a direction parallel or antiparallel to the growth direction of the semiconductor body, the first region directly follows the active region. The first region is arranged on a side of the active region facing the p-doped side of the semiconductor body and is therefore located on the p-side of the active region.

The second region may be arranged on a side of the first region facing away from the active region. That is to say that the first region is arranged between the second region and the active region. Further layers or regions can be arranged between the first region and the second region. Furthermore, it is possible for the first region and the second region to adjoin one another directly.

The regions of the optoelectronic semiconductor body preferably extend over the entire cross section of the semiconductor body and have a predefinable thickness in a vertical direction perpendicular to the main plane of extension of the semiconductor body.

The first region may have an electronic band gap larger than the electronic band gap of the quantum well and smaller than or equal to the electronic band gap of the second region. In particular, the electronic band gap of the first region is larger than the electronic band gap of each quantum well in the active region. Preferably, the electronic band gap of the second region is larger than the electronic band gap of the first region.

The first region and the second region may contain aluminum. That is to say that the first region and the second region are formed, for example, with AlGaN, wherein the aluminum concentration is, for example, at least 2 percent, in particular at least 5 percent. The first region and the second region may in particular be free of indium or the concentration of indium in these regions is very low and is, for example, less than 1%. By using aluminum in the first and second regions, an electronic band gap larger than the electronic band gap of the quantum well can be set in a particularly efficient manner.

An optoelectronic semiconductor body may be specified having
an active region comprising a quantum well that generates electromagnetic radiation,
a first region that impedes the passage of charge carriers from the active region,
a second region that impedes the passage of charge carriers from the active region, wherein
the semiconductor body is based on a nitride compound semiconductor material,
the first region is directly adjacent to the active region on a p-side,
the second region is arranged on a side of the first region facing away from the active region,
the first region has an electronic band gap larger than the electronic band gap of the quantum well and smaller than or equal to the electronic band gap of the second region, and
the first region and the second region contain aluminum.

An optoelectronic semiconductor body described here is based, among other things, on the consideration that a suitable doping profile for the p-type dopant of the semiconductor body enables an optoelectronic semiconductor body that may generate electromagnetic radiation of high efficiency for long periods of time.

For this reason, it is necessary to control the diffusion of the p-type dopant or defects (e.g., point defects) in the semiconductor body in a manner enabling an efficient injection of holes into the active region, without the p-type dopant or defects or foreign atoms induced by the doping being able to enter the p-side quantum wells.

The p-type dopant is, for example, magnesium that tends to diffuse in the nitride compound semiconductor material-based semiconductor body and may greatly reduce the efficiency of radiation generation when entering the active region.

To limit the diffusion of the p-type dopant, it would be possible, for example, to introduce nominally undoped regions between the active region and the p-doped region formed with aluminum-free layers. The dopant profile can furthermore be adjusted by a precise control of the growth temperatures to regulate the diffusion of the p-type dopant. Temperature fluctuations during growth of the p-side of the semiconductor body then adversely affect efficiency and aging stability.

A semiconductor body described here is based, among other things, on the recognition that a first region containing aluminum and being arranged directly on the active region and having an electronic band gap larger than the electronic band gap of the active region may increase the confinement of holes and electrons in the active region. The first region thus forms a charge carrier blocking layer, in particular also an electron blocking layer. Furthermore, the interface defined by the transition acts as a barrier to migrating defects or diffusing foreign atoms or dopants.

The second region having an electronic band gap equal to or greater than the electronic band gap of the first region, then additionally reinforces the capture of charge carriers and may be formed, for example, on account of a corresponding doping for injecting holes into the active region.

The loss of charge carriers, in particular electrons, may in particular lead to a reduction in the internal quantum efficiency of the active region in particular for larger operating currents (so-called "droop"). This problem is reduced by the first region and the second region.

In that the first region is arranged between the second region and the active region and has, for example, a band gap smaller than the band gap of the second region, but larger than the band gap of the quantum well in the active region, the first region can act as a diffusion barrier for the passage of the p-type dopant or foreign atoms or defects.

An intermediate region may be arranged between the first and second regions, wherein the intermediate region has an electronic band gap larger than the electronic band gap of the quantum well and smaller than the electronic band gap of the first region and of the second region.

In particular, the electronic band gap is larger than the electronic band gap of each quantum well of the active region. The intermediate region thus impedes or prevents the passage of electrons from the active region. Furthermore, the intermediate region prevents diffusion of the p-type dopant into the active region.

In particular, it is possible for the intermediate region to be partially or completely free of aluminum. The fact that the intermediate region is partially free of aluminum may, in particular, mean that at least one layer or layer sequence of the intermediate region is free of aluminum. That is to say that no aluminum is introduced into the intermediate region during production of this layer or layer sequence.

The intermediate region may comprise at least two subregions that differ from one another in terms of their material composition and electronic band gaps. The subregions are formed, for example, as layers, which fill the entire cross section of the semiconductor body and have a predefinable thickness in the vertical direction.

For example, the intermediate region has five or more subregions that differ in terms of their material composition at least in pairs. For example, two directly adjacent subregions differ with regard to their material composition, wherein subregions may border on a subregion on opposite sides having the same material composition and the same electronic band gap, and differ from the material composition and the electronic band gap of the directly adjoining subregion. For example, subregions with larger and smaller band gaps can be arranged alternately along the vertical direction, wherein the band gap of each subregion is larger than the band gap of the quantum well and smaller than the band gap of the first and second regions.

The fact that the intermediate region is partially free of aluminum, may, in particular, mean that at least one subregion of the intermediate region is free of aluminum. That is to say that no aluminum is introduced into the intermediate region during the production of this subregion.

The intermediate region may directly adjoin the first region and may directly adjoin the second region. That is to say that in vertical direction the first region then directly follows the active region, the intermediate region directly follows the first region and the second region directly follows the intermediate region. This sequence of regions ensures efficient confinement of charge carriers in the active region and forms an efficient barrier against diffusion of p-type dopant into the active region.

Directly adjacent subregions of the intermediate region may differ from one another with regard to their band gap. As a result, a plurality of interfaces are formed between subregions in the intermediate region at which a jump occurs in the band gap. Surprisingly, we found that precisely these interfaces between the subregions efficiently prevent diffusion of the p-type dopant, in particular the diffusion of magnesium into the active region.

The second region may have an aluminum concentration greater than the aluminum concentration in the first region. For example, the first region has an aluminum concentration greater than 5 percent. The second region then has an aluminum concentration greater than 5 percent, in particular an aluminum concentration greater than 10 percent.

The second region may be p-doped. That is to say that the second region is, for example, the region of the semiconductor body closest to the active region which is p-doped. For example, the second region is doped with magnesium and has a dopant concentration of at least $10^{19}/cm^3$. In a further example, the p-type doping can be realized by alternative dopants or foreign atoms such as C, Be or the like.

The first region and, if present, the intermediate region may nominally be undoped and/or n-doped.

Nominally undoped means that these regions of the semiconductor body are not specifically doped during production. A p-type dopant may, however, pass into the first region and the intermediate region to a small extent by diffusion processes during the production of subsequent regions. For example, the concentration of the p-type dopant in the two regions is then at most $10^{20}/cm^3$. In particular, the concentration of the p-type dopant is lower than in the second region.

Alternatively or additionally, it is possible for the regions to be n-doped to a small extent. For example, the doping may be achieved during production with silicon by adding silane ($SiH_4$). Thus, an n-type co-doping takes place, which can lead to formation of a particularly sharp boundary between the n-doped region and the p-doped region of the semiconductor body. In particular, the co-doping can impede diffusion processes of the p-type dopant towards the active region.

According to at least one example of the semiconductor body, the first region is formed with $Al_{y1}Ga_{1-y1}N$ or with $Al_{y1}In_xGa_{1-y1}N$, wherein y1 is >0.05 and x<0.1. The first region has, for example, a thickness between at least 1 nm and at most 5 nm. The intermediate region has a subregion which is formed with $In_xGa_{1-x}N$, wherein x>0.01 and x<0.05, wherein the subregion has, for example, a thickness of at least 0.05 nm and at most 5 nm. Furthermore, the intermediate region has a subregion formed with GaN and has, for example, a thickness of at least 0.5 nm and at most 5 nm. The second region is then formed with $Al_{y2}Ga_{1-y2}N$ or with $Al_{y2}In_xGa_{1-y2}N$, wherein y2>y1 and x<0.01 and the second region has, for example, a thickness of at least 1 nm and at most 20 nm.

Such a configuration of the first region, of the intermediate region and the second region proves to be particularly advantageous with regard to the confinement of charge carriers in the active region and obstruction of diffusion of the p-type dopant into the active region.

We further provide a light-emitting diode. The light-emitting diode comprises an optoelectronic semiconductor body described herein. That is to say that all the features disclosed for the semiconductor body are also disclosed for the light-emitting diode and vice versa. The light-emitting diode further comprises first and second connection points designed to electrically contact the semiconductor body.

The light-emitting diode emits electromagnetic radiation having a peak wavelength of less than 480 nm during operation, in particular of less than 400 nm. In particular, the light-emitting diode emits electromagnetic radiation having a peak wavelength 360 nm to 480 nm, in particular 360 nm to 395 nm. We found that, on account of the improved confinement of charge carriers in the active region for one the optoelectronic semiconductor bodies described here, the use of the semiconductor body to generate UV radiation, in particular of UVA radiation and of blue light, is particularly advantageous.

In the following, the optoelectronic semiconductor body described here and the light-emitting diode described here will be explained in more detail on the basis of examples and associated figures.

Equal, identical or identically operating elements are provided with the same references in the figures. The figures and the size ratios of the elements illustrated in the figures are not to be regarded as being to scale. Rather, individual elements may be represented with an exaggerated size for better representability and/or for better comprehensibility.

FIG. 1 schematically shows a band diagram for an optoelectronic semiconductor body. The optoelectronic semiconductor body comprises an active region 1 having at least one quantum well 1a, in particular a multiple quantum well structure having a plurality of quantum wells. The active region 1 preferably comprises five identical quantum wells 1a between each of which a barrier is arranged. The quantum wells 1a each have a thickness of, for example, 3 nm, the barriers each have a thickness of, for example, 4.7 nm. The quantum wells 1a are formed with InGaN, the barriers with AlGaN.

The first region 2 is directly adjacent to the active region 1 on the p-side. The first region 2 is formed with $Al_{y1}Ga_{1-y1}N$ or by $Al_{y1}In_xGa_{1-y1}N$. In this example, y1 is preferably greater than 0.05 and x<0.01. The thickness of the first region is, for example, at least 1 nm and at most 5 nm.

The intermediate region 3 directly follows the side of the first region 2 facing away from the active region 1. The intermediate region 3 comprises a first subregion 3a formed with GaN, a second subregion 3b formed with $In_xGa_{1-x}N$, a third subregion 3c formed with GaN, a fourth subregion 3d formed with $In_xGa_{1-x}N$, a fifth subregion 3e formed with GaN. In each instance, the thickness of the subregions is at least 0.05 nm and at most 5 nm.

In this example, x is preferably greater than 0.01 and less than 0.05. The intermediate region is in particular free of aluminum.

Directly on the side of the intermediate region 3 facing away from the first region 2, the second region 4 is arranged, which is formed with $Al_{y2}Ga_{1-y2}N$ or with $Al_{y2}In_xGa_{1-y2}N$. Here, x<0.01. Y2 is preferably greater than y1, for example, 0.06 or greater. The thickness of the second region is at least 1 nm and at most 20 nm.

The first region 2 has an electronic band gap E2 larger than the electronic band gap E1 of the quantum well 1a and larger than the electronic band gaps E3a, E3b, E3c, E3d, E3e in the intermediate region 3. The subregions 3b and 3d in the intermediate region 3 have band gaps E3b, E3d smaller than the band gaps E3a, E3c, E3e in the subregions 3a, 3c and 3e. However, all band gaps in the intermediate region 3 are larger than the band gap of the quantum well 1a.

In the second region 4, the semiconductor body has a band gap E4 greater than the band gap in all other regions and greater than the band gap E1 in the quantum well.

Figure 2:
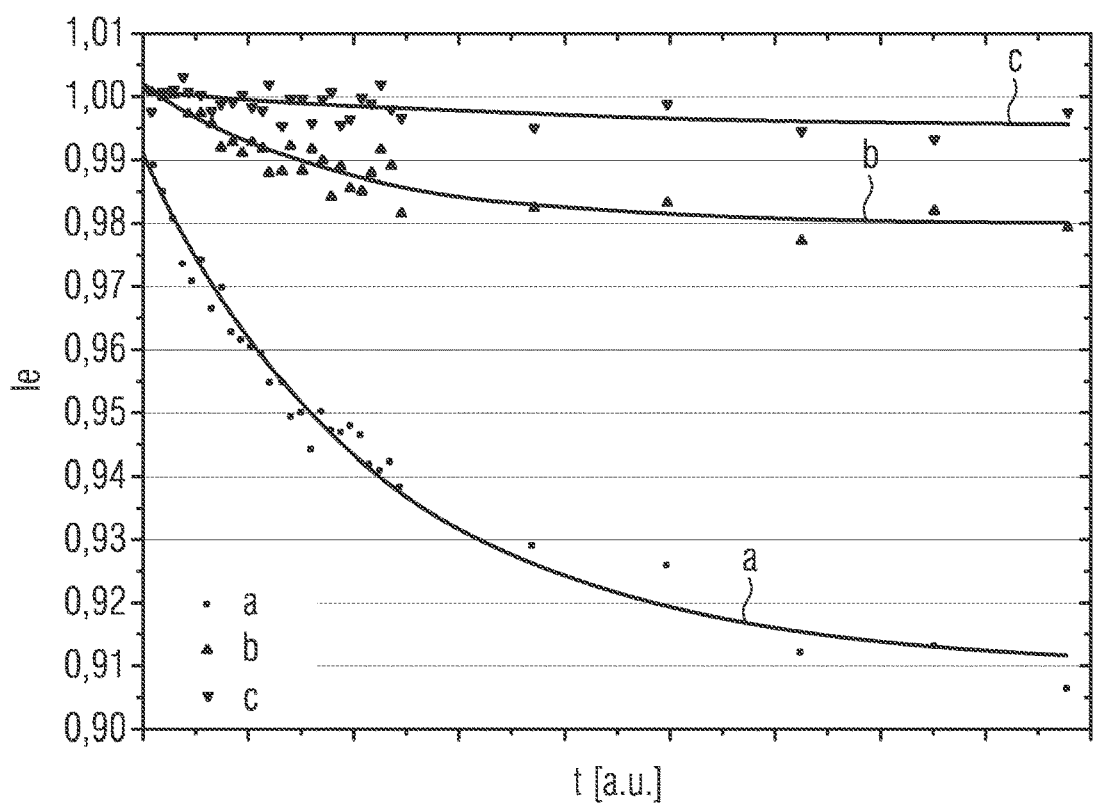
FIG. 2 is a graphical plot of the advantages of an optoelectronic semiconductor body.

The schematic plot of FIG. 2 shows the intensity of the emitted light of a light-emitting diode having an optoelectronic semiconductor body plotted against the operating time t and normalized to the intensity at the time t=0. The curve c is a plot for a semiconductor body, whereas the curves b and a are comparative curves for semiconductor bodies which do not have the first region 2 and the intermediate region 3. The p-side of the semiconductor body of curve b was produced at a lower growth temperature, than the p-side of the semiconductor body of the curve a. This leads to a reduced diffusion of magnesium into the active region 1 during production. After about 500 operating hours, however, this positive effect is no longer detectable (not shown).

As can be seen from the graphical plot, the intensity of the generated light of our semiconductor body hardly changes over time. That is to say that the semiconductor body has a particularly favorable aging behavior, which can be attributed in particular to the improved doping profile with the p-type dopant, the improved confinement of charge carriers in the active region and the reduced diffusion of dopant into the active region both during production and during operation.

FIG. 3 shows a schematic illustration of a light-emitting diode having a semiconductor body 10. In addition to the described regions, the light-emitting diode comprises an n-conducting region, which is electrically contacted, for example, via the first connection point 11. The second connection point 12 is located on the opposite side of the semiconductor body 10, via which the semiconductor body is connected, for example, on the p-side.

During operation, the light-emitting diode generates electromagnetic radiation having a peak wavelength of less than 480 nm, in particular of less than 400 nm. We found that, on account of the improved confinement of charge carriers in the active region for one the optoelectronic semiconductor bodies described here, the use of the semiconductor body to generate UV radiation, in particular of UVA radiation, is particularly advantageous. The light-emitting diode is then a light-emitting diode emitting UV radiation.

Our semiconductor bodies and light-emitting diodes are characterized in particular by the following advantages:

The semiconductor body exhibits a higher tolerance to temperature fluctuations during production of the p-doped side of the semiconductor body since the described regions effectively suppress a diffusion of the p-type dopant into the active region. The probability for a diffusion of the p-type dopant into the active region is thus reduced.

Furthermore, the injection of holes in a semiconductor body is improved in contrast to a semiconductor body without the regions. The outflow of electrons from the active region is also strongly suppressed for an active region having a low indium concentration, as is used in particular to generate UV radiation, due to the regions of the semiconductor body described here.

Our LEDs and semiconductor diodes are not restricted to the examples by the description on the basis of the examples. Rather, this disclosure encompasses any new feature and also any combination of features including in particular any combination of features in the appended claims, even if the feature or combination itself is not explicitly specified in the claims or examples.

Priority of DE 10 2016 111 929.6 is claimed, the subject matter of which is incorporated herein by reference.

What is claimed is:

1. A light-emitting diode comprising:
   a semiconductor body and electrical connection points for contacting the semiconductor body, the semiconductor body comprising
   an active region comprising a quantum well that generates electromagnetic radiation,
   a first region that impedes passage of charge carriers from the active region, and
   a second region that impedes passage of charge carriers from the active region, wherein
   the semiconductor body is based on a nitride compound semiconductor material,
   the first region is directly adjacent to the active region on a p-side,
   the second region is arranged on a side of the first region facing away from the active region,
   the first region has an electronic band gap larger than the electronic band gap of the quantum well and less than or equal to an electronic band gap of the second region,
   the first region and the second region contain aluminum,
   the active region emits electromagnetic radiation having a peak wavelength of less than 480 nm,
   the first region is n-doped and the second region is p-doped.

2. The light-emitting diode according to claim 1, further comprising an intermediate region arranged between the first region and the second region, wherein the intermediate region has an electronic band gap larger than the electronic band gap of the quantum well and smaller than the electronic band gaps of the first region and of the second region, and the intermediate region is at least partially free of aluminum.

3. The light-emitting diode according to claim 2, wherein the intermediate region has at least two subregions that differ from one another in their material composition and electronic band gap.

4. The light-emitting diode according to claim 3, wherein at least one of the subregions is free of aluminum.

5. The light-emitting diode according to claim 2, wherein the intermediate region directly adjoins the first region and directly adjoins the second region.

6. The light-emitting diode according to claim 3, wherein directly adjoining subregions of the intermediate region have different band gaps from each other.

7. The light-emitting diode according to claim 1, wherein the second region has an aluminum concentration greater than an aluminum concentration in the first region.

8. The light-emitting diode according to claim 2, wherein the intermediate region is nominally undoped.

9. The light-emitting diode according to claim 2, wherein the intermediate region is n-doped.

10. The light-emitting diode according to claim 1, wherein the active region emits electromagnetic radiation having a peak wavelength between 360 nm and 395 nm.

11. The light-emitting diode according to claim 1, wherein the second region is formed with $Al_{y2}Ga_{1-y2}N$ or with $Al_{y2}In_xGa_{1-y2}N$, and x is smaller than 0.01, Y2 is 0.06 or greater.

12. The light-emitting diode according to claim 1, wherein a thickness of the second region is 1 nm to 20 nm.

13. The light-emitting diode according to claim 1, wherein the first region is formed with $Al_{y1}Ga_{1-y1}N$ or $Al_{y1}In_xGa_{1-y1}N$, and y1 is greater than 0.05 and x is smaller than 0.01.

14. The light-emitting diode according to claim 1, wherein a thickness of the first region is 1 nm to 5 nm.

15. The light-emitting diode according to claim 1, wherein
the first region is formed with $Al_{y1}In_xGa_{1-y1}N$,
the second region is formed with $Al_{y2}In_xGa_{1-y2}N$,
x is greater than 0 and smaller than 0.01, and
Y2 is greater than y1.

16. A light-emitting diode comprising:
a semiconductor body and electrical connection points for contacting the semiconductor body, the semiconductor body comprising
an active region comprising a quantum well that generates electromagnetic radiation,
a first region that impedes passage of charge carriers from the active region, and
a second region that impedes passage of charge carriers from the active region, wherein
the semiconductor body is based on a nitride compound semiconductor material,
the first region is directly adjacent to the active region on a p-side,
the second region is arranged on a side of the first region facing away from the active region,
the first region has an electronic band gap larger than the electronic band gap of the quantum well and less than or equal to an electronic band gap of the second region,
the first region and the second region contain aluminum,
the active region emits electromagnetic radiation having a peak wavelength of less than 480 nm,
and the first region is nominally undoped.

* * * * *